United States Patent
Yeh et al.

(10) Patent No.: US 8,737,073 B2
(45) Date of Patent: May 27, 2014

(54) SYSTEMS AND METHODS PROVIDING THERMAL SPREADING FOR AN LED MODULE

(75) Inventors: Wei-Yu Yeh, Tainan (TW); Chih-Hsuan Sun, Kaohsiung (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 421 days.

(21) Appl. No.: 13/024,017

(22) Filed: Feb. 9, 2011

(65) Prior Publication Data

US 2012/0201007 A1    Aug. 9, 2012

(51) Int. Cl.
*H05K 7/20* (2006.01)

(52) U.S. Cl.
USPC ........... 361/709; 361/708; 361/719; 361/808; 361/810; 174/260; 174/548; 257/720

(58) Field of Classification Search
USPC ......... 361/676, 688–722, 760–767, 806–809, 361/831
See application file for complete search history.

(56) References Cited

U.S. PATENT DOCUMENTS

| | | | | |
|---|---|---|---|---|
| 5,857,767 A | * | 1/1999 | Hochstein | 362/294 |
| 6,517,218 B2 | * | 2/2003 | Hochstein | 362/294 |
| 7,719,110 B2 | * | 5/2010 | Zhao et al. | 257/707 |
| 7,772,036 B2 | * | 8/2010 | Bauer et al. | 438/112 |
| 8,246,219 B2 | * | 8/2012 | Teng et al. | 362/311.03 |
| 8,304,660 B2 | * | 11/2012 | Tuan et al. | 174/258 |
| 2005/0161682 A1 | * | 7/2005 | Mazzochette et al. | 257/79 |
| 2009/0045503 A1 | * | 2/2009 | Koduri | 257/693 |
| 2010/0072510 A1 | * | 3/2010 | Lin et al. | 257/99 |
| 2010/0155748 A1 | * | 6/2010 | Chan et al. | 257/89 |

* cited by examiner

*Primary Examiner* — Courtney Smith
(74) *Attorney, Agent, or Firm* — Haynes and Boone, LLP

(57) ABSTRACT

A Light Emitting Diode (LED) module includes a circuit board having a front side and a back side, a heat sink coupled to the back side of the circuit board, a thermal pad disposed on a front side of the circuit board, an LED disposed on the front side of the circuit board. The LED is in thermal contact with the thermal pad. The module further includes a heat spreading device placed over the thermal pad and in thermal contact with the thermal pad.

20 Claims, 4 Drawing Sheets

SYSTEMS AND METHODS PROVIDING THERMAL SPREADING FOR AN LED MODULE

BACKGROUND

The present disclosure relates generally to Light Emitting Diode (LED) module manufacturing. Specifically, the present disclosure relates to systems and methods that provide a front-side heat spreading structure for an LED module.

Many conventional systems mount LEDs to circuit boards. Such circuit boards have a front side, where the LEDs are mounted, and a backside opposite the front side. LEDs can produce heat, so some conventional systems include mechanisms to remove the heat. One example of a system to remove the heat is a heat sink mounted to the back side of the circuit board. The heat can be moved from the front side LED to the backside heat sink using a thermal via or a thermal pad and an intermediate layer of thermal conductive material.

However, there are disadvantages to having only a backside heat sink. For instance, structures to move the heat from the front side to the back side take up space on and within the circuit board. Also, removing the heat only through the back side may not provide enough heat dissipation for some applications. More efficient and effective heat dissipation is called for.

SUMMARY

The present disclosure provides for many different embodiments. In a first embodiment, a Light Emitting Diode (LED) module includes a circuit board having a front side and a back side, a heat sink coupled to the back side of the circuit board, a thermal pad disposed on a front side of the circuit board, an LED disposed on the front side of the circuit board, the LED in thermal contact with the thermal pad, and a heat spreading device placed over the thermal pad and in thermal contact with the thermal pad.

In another embodiment, a method for manufacturing an LED module includes creating a circuit layout on a front side surface of a circuit board. The circuit layout includes a metal thermal pad. The method also includes disposing a plurality of LEDs on the circuit layout so that each of the LEDs is in thermal communication with the thermal pad and assembling a heat spreading structure over the front side surface of the circuit board so that the heat spreading structure is in thermal communication with the thermal pad. The heat spreading structure exposes the plurality of LEDs.

In another embodiment, an LED assembly includes a circuit substrate that has a front side and a back side, a thermal pad formed of thermally conductive material on the front side of the circuit substrate, an LED disposed on the front side of the circuit substrate and in contact with the thermal pad, and means for spreading heat produced by the LED, the heat spreading means placed over the front side of the circuit substrate and having a hole to expose the LED.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
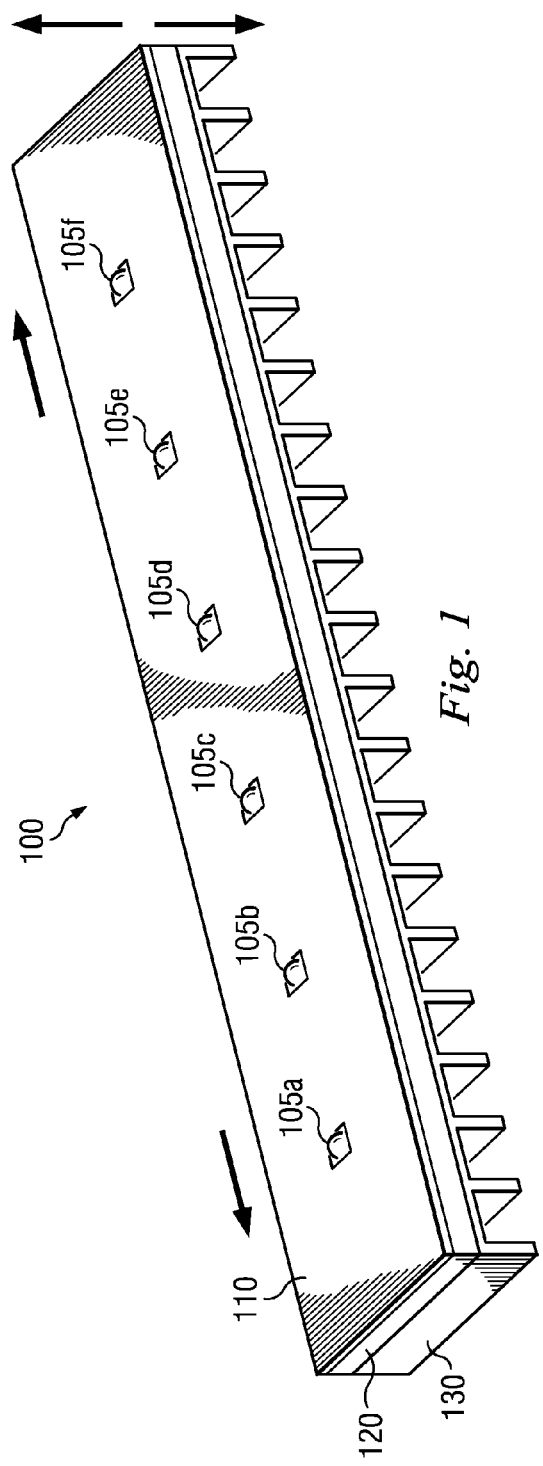
FIG. 1 is an illustration of an exemplary LED module according to one embodiment.

The present disclosure relates generally to LED modules. Specifically, the present disclosure relates to a front side heat spreading structure for an LED module. While the examples herein discuss applying the techniques to a Metal Core Printed Circuit Board (MCPCB), it is understood that the scope of embodiments is not limited to MCPCBs or even PCBs generally. The scope of embodiments includes all kinds of substrates for circuit layouts, including ceramic, FR-4, and the like.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

With reference now to the figures, FIG. 1 is an illustration of an exemplary LED module 100 according to one embodiment. LED module 100 has LEDs 105, which are disposed upon circuit board 120 by, e.g., Surface Mount Technology (SMT) or through-hole mounting. Circuit board 120 in this example has a front side (top) and back side (contacting heat sink 130). The front side, and perhaps other intermediate layers, has metal conductive paths formed of copper (Cu) or other metal. Some of the conductive paths are for power, ground, or signals and are referred to herein as electrical conductive paths. Others of the conductive paths are thermal conductive paths. The thermal conductive paths are isolated from the electrical conductive paths and are arranged to create pathways for heat to travel from LEDs 105 to heat spreading structure 110 and/or heat sink 130. In some embodiments, electrical conductive paths are used as thermal conductive paths so long as placement of heat spreading structure 110 over the electrical conductive paths does not cause short circuits. For instance, when electrical conductive paths are used as thermal conductive paths, various embodiments add electrically-insulative thermal conductive material to be the interface between the electrical conductive path and heat spreading structure. Thermal conductive paths are shown and described in more detail with respect to FIG. 4.

Of note in module 100 is the placement of heat spreading structure 110 on the front side of module 100. Heat spreading structure 110 has holes that expose LEDs 105 but otherwise heat spreading structure 110 covers substantially all of the front side of circuit board 120. Together, heat spreading structure 110 and heat sink 130 spread heat from top to bottom and side to side of module 100, as shown by the arrows.

Figure 2:
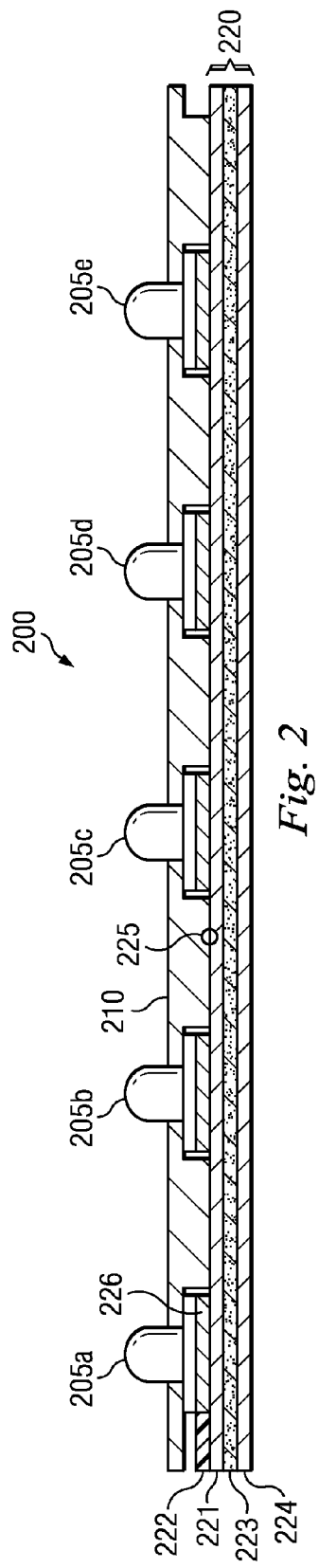
FIG. 2 is a cross-sectional illustration of an exemplary LED package according to one embodiment.

FIG. 2 is a cross-sectional illustration of exemplary LED package 200 according to one embodiment. Package 200 includes MCPCB 220, upon which LEDs 205 are mounted using solder pads (e.g., solder pad 226). PCB 220 includes Cu layer 221 with etched electrical paths (not shown), solder mask 222, thermally conductive material 223, and aluminum (Al) layer 224. Thermally conductive material 223 includes in this example electrically insulative gel. LED package 200 also includes heat spreading structure 210 disposed over the front side of LED package 200. The interface 225 of heat spreading structure 110 and PCB 220 includes a thermally conductive material, such as thermal grease or tape (not shown) to ensure reliable contact and heat transfer between the surface of PCB 220 and heat spreading structure 210. Heat spreading structure 110 may be electrically isolated from circuitry (not shown) at interface 225 by use of grease, tape, or even ink.

PCB 220 in this example can be manufactured using conventional methods. Further, in this example, heat spreading structure 110 is formed of Al as a separate component that is positioned over PCB 220 and attached thereto using screws or tape. However, other techniques now known or later developed for manufacturing PCB 220 and structure 210 and for attaching structure 210 may be employed in some embodiments. Furthermore, while not shown in FIG. 2, it is understood that LED package 200 may include a back side mounted heat sink as well.

Figure 3:
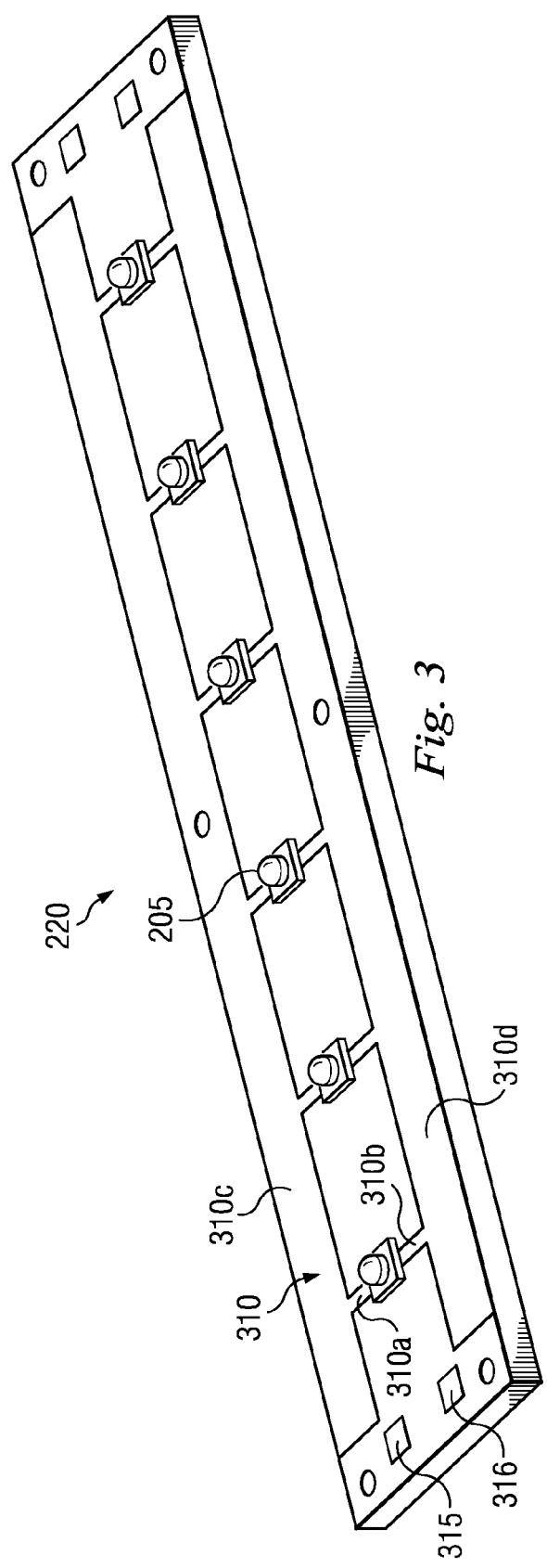
FIG. 3 is an illustration of the exemplary circuit board of FIG. 2, shown with LEDs mounted thereon.

FIG. 3 is an illustration of exemplary circuit board 220 of FIG. 2, shown with LEDs mounted thereon. FIG. 3 provides a view of thermal path 310, which in this example includes a metal layer on the front side surface that contacts the bottoms of the respective LEDs. Thermal path 310 has thin portions (e.g., portions 310a and 310b) that contact the LEDs and wider portions (portions 310c and 310d) arranged laterally on the front surface. Electrical contact pads 315, 316 provide for an interface to a power supply and ground and distribute the power through electrical paths (not shown) underneath the layer illustrated in FIG. 3.

Figure 4:
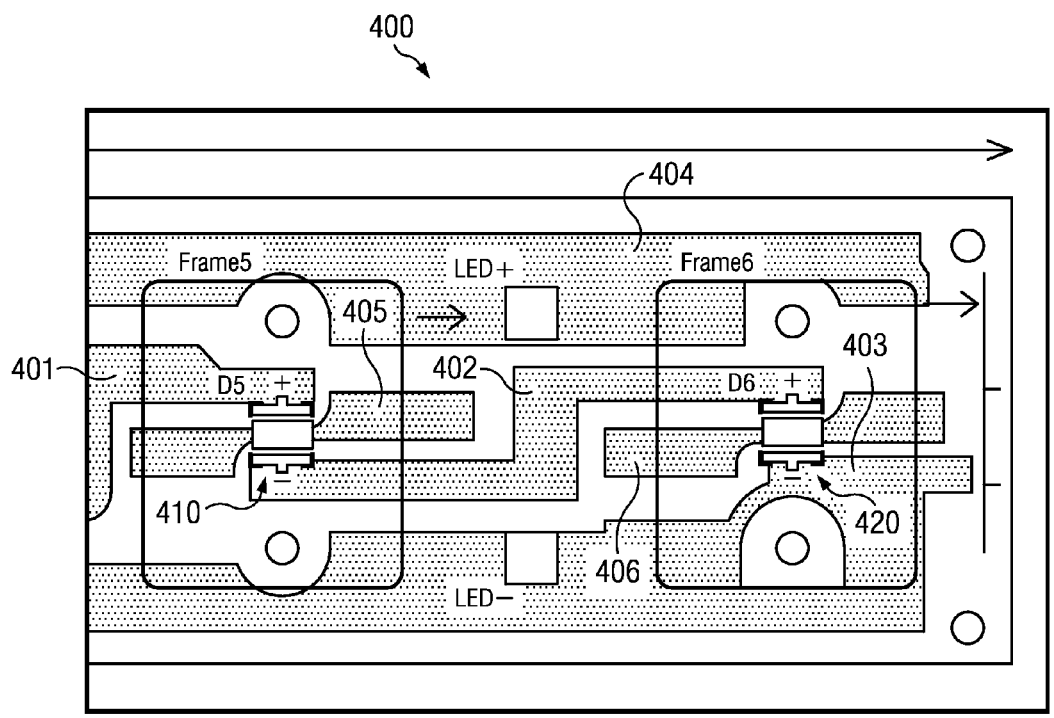
FIG. 4 is an illustration of a portion of another exemplary circuit board shown as it would appear using Computer Aided Design (CAD), according to one embodiment.

FIG. 4 is an illustration of a portion of another exemplary circuit board 400 shown as it would appear using Computer Aided Design (CAD). Circuit board 400 includes power paths 410-404, which are in electrical communication with power (LED+, path 404) and ground (LED −, path 403). Power paths 401-404 are also in electrical communication with solder pads 410, 420. Circuit board 400 also includes thermal pads 405, 406, which are electrically isolated from power paths 401-404. It should be noted that in some embodiments, the Cu that makes up paths 401-404 is covered in electrically insulative, thermally conductive ink from a PCB etch process (except for the portions under pads 410, 420).

Thermal pad 405 is in thermal communication with solder pad 410, and thermal pad 406 is in thermal communication with solder pad 420. Thus, thermal pads 405, 406 are configured to distribute heat away from LEDs (not shown) mounted upon respective solder pads 410, 420. While not shown in FIG. 4, it is noted that a front side-mounted heat spreading structure (such as heat spreading structure 110 of FIG. 1) may be mounted upon circuit board 400 so that it is in thermal communication with thermal pads 405, 406 and can dissipate heat to another structure or to the atmosphere.

Figure 5:
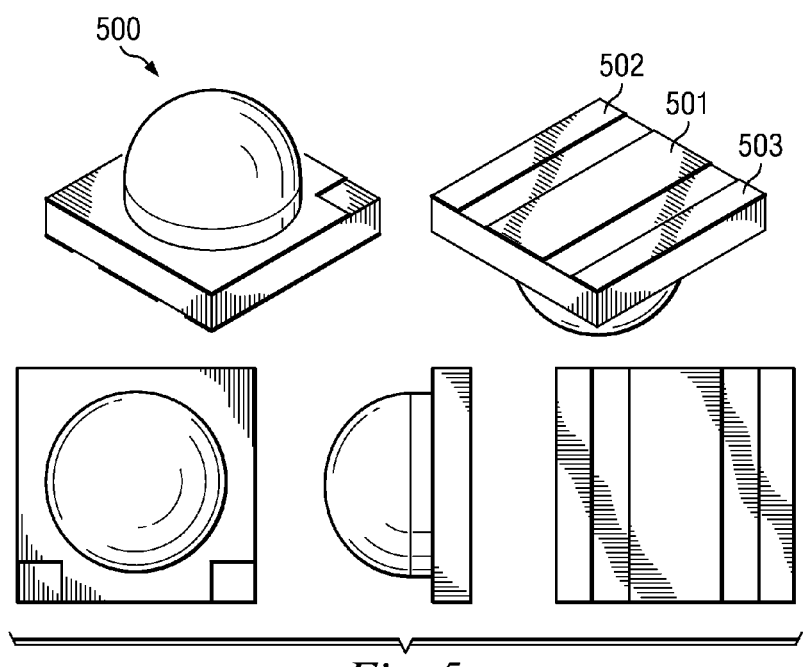
FIG. 5 shows an exemplary LED for use with the circuit board of the embodiment of FIG. 4.

FIG. 5 shows exemplary LED 500 for use with circuit board 400 of the embodiment of FIG. 4. In FIG. 5, LED 500 is shown in a variety of views for a better understanding of this particular embodiment. In one example, the bottom surface of LED 500 is mounted to solder pad 410 so that middle contact 501 is coupled to thermal pad 405, contact 502 is coupled to power path 401, and contact 503 is coupled to power path 402.

Figure 6:
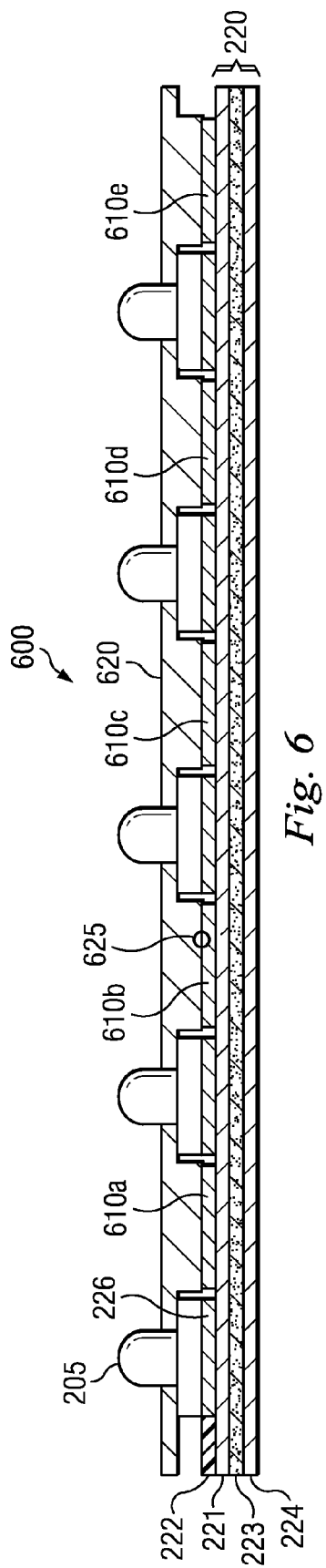
FIG. 6 is an illustration of another exemplary LED package according to one embodiment.

FIG. 6 is an illustration of another exemplary LED package 600 according to one embodiment. In the embodiment of FIG. 6, heat spreading structure 620 is mounted upon circuit board 220 so that heat spreading structure 620 is in thermal communication with the LEDs through solder pads 610. While not shown in FIG. 6, solder pads 610 are in thermal communication with one or more thermal pads that distribute heat from the LEDs. Interface 625 between solder pads 610 and heat spreading structure 620 may or may not include a thermal grease or tape. In fact, in some embodiments, the solder pads 610 act as thermal spreading surfaces that make reliable contact with heat spreading structure 620 so that thermal grease and tape can be omitted. Some embodiments may also include a back side mounted heat sink (not shown) as well.

Figure 7:
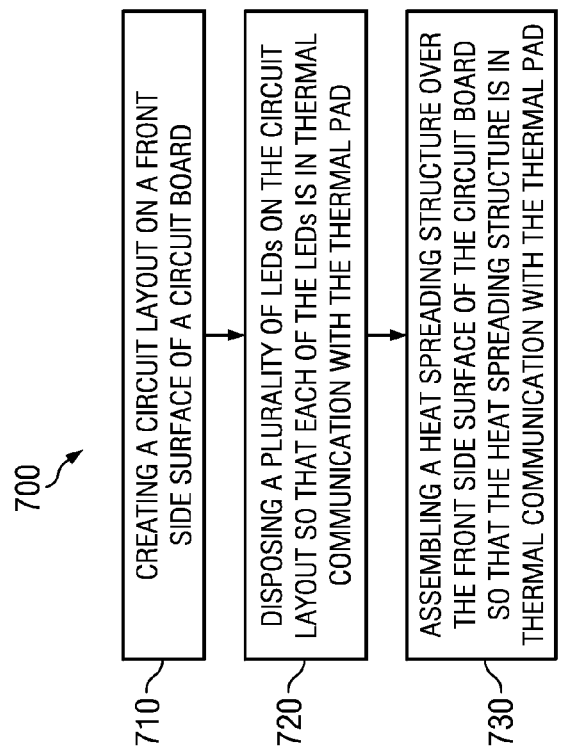
FIG. 7 is an illustration of exemplary method for manufacturing an LED module according to one embodiment.

FIG. 7 is an illustration of exemplary method 700, for manufacturing an LED module, according to one embodiment. Method 700 may be performed in some instances by one or more persons and/or machines in a single manufacturing site or multiple manufacturing sites.

In block 710, a circuit layout is created on a front side surface of a circuit board. In one example, the circuit board includes a thin layer of metal, such as Cu, on its surface. The layer of metal is then patterned using a mask and etchant. However, any technique now known or later developed may be used to create the circuit layout.

Further in this example, the circuit layout includes electrical conductive paths for power, ground, and signals and thermal conductive paths for distributing heat. The thermal conductive paths may be different from the electrical paths. An example of a circuit layout is shown in FIG. 4.

In block 720, a plurality of LEDs are disposed in the circuit layout so that each of the LEDs is in thermal communication with a thermal pad in the circuit layout. FIGS. 4 and 5 above illustrate how an LED can be arranged upon a circuit layout in one embodiment to be in thermal communication with appropriate components.

In block 730, a heat spreading structure is assembled over the front side surface of the circuit board so that the heat spreading structure is in thermal communication with the thermal pad. The heat spreading structure may be thermally coupled to the thermal pad using a solder pad or not using a solder pad. Furthermore, some embodiments may or may not employ a heat-conductive thermal insulating material, such as thermal grease or tape or ink, at an interface of the heat spreading structure and the circuit layout.

Block 730 includes in some embodiments arranging the heat spreading structure so that it covers substantially all of the circuit board, covering the entire circuit layout, while including one or more apertures to expose the LEDs. In other examples, the heat spreading structure may leave some areas of the circuit layout exposed.

The heat spreading structure can be assembled in any manner appropriate for a given application. Some embodiments employ screws, tape, and/or adhesive to secure the heat spreading structure to the circuit board.

Method 700 is exemplary, and the scope of embodiments is not limited only to that shown in FIG. 7. Other embodiments may add, omit, modify, or rearrange actions. For instance, some embodiments further include mounting a heat sink on the back side of the circuit board. Moreover, some embodiments may further include deploying the LED module in an application, such as an LED display or LED lighting fixture. The application may include a control system that uses sophisticated algorithms to drive the LEDs to provide desired results, such as outputting a desired color of light, outputting a desired pattern, and/or the like.

Table 1 includes examples of various embodiments using a variety of substrates and other materials. Table 1 is exemplary, as the scope of embodiments may include other materials adapted for use in some applications.

TABLE 1

| Item | Material 1 | Material 2 | Material 3 | Material 4 |
|---|---|---|---|---|
| substrate | Al-MCPCB | Cu-MCPCB | Ceramic | FR4 |
| Heat sink (back side) | Al | Cu | Fe | Ag |
| PCB pad for process | Chemical gold solder | Sn solder | OSP solder | OSP solder |
| Heat spreading structure (front side) | Al | Cu | Fe | Ag |
| Thermal interface material | Grease | Tape | gel | |

Various embodiments may include advantages over other techniques that employ only a back side heat spreading structure. For instance, some embodiments improve the performance of the LED module by shortening the thermal path from the LEDs to a heat spreading structure, which makes for more effective use of the heat spreading structure. Furthermore, embodiments that employ heat spreading structures on both the front side and back side of the circuit board double the paths for thermal spreading. Increased thermal spreading may enhance reliability in applications where heat dissipation is crucial, such as in high-power LED lighting fixtures.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A Light Emitting Diode (LED) module comprising:
a circuit board having a front side and a back side;
a heat sink coupled to the back side of the circuit board;
a thermal pad disposed on the front side of the circuit board;
an LED disposed on the front side of the circuit board, the LED in thermal contact with the thermal pad; and
a heat spreading device placed over the thermal pad and in thermal contact with the thermal pad, wherein the heat spreading device is coupled to the thermal pad using a thermal interface material, wherein the thermal interface material includes at least one of a thermal conductive gel and a thermal conductive tape.

2. The LED module of claim 1 in which the circuit board comprises at least one of an FR-4 PCB and a metal core PCB.

3. The LED module of claim 1 in which the heat spreading device comprises at least one of aluminum, copper, iron, and silver.

4. The LED module of claim 1 in which the heat spreading device covers substantially the entire surface of the front side of the circuit board and has a hole to expose the LED.

5. The LED module of claim 1 in which the thermal pad comprises a metal layer on the circuit board, the metal layer of the thermal pad being isolated from electrical signals on the circuit board.

6. The LED module of claim 1 in which the thermal pad comprises a metal layer on the circuit board, the metal layer of the thermal pad being in direct contact with the LED.

7. A method for manufacturing a Light Emitting Diode (LED) module, the method comprising:
creating a circuit layout on a front side surface of a circuit board, the circuit layout including a metal thermal pad;
disposing a plurality of LEDs on the circuit layout so that each of the LEDs is in thermal communication and direct contact with the thermal metal pad; and
assembling a heat spreading structure over the front side surface of the circuit board so that the heat spreading structure is in thermal communication with the thermal metal pad, the heat spreading structure exposing the plurality of LEDs, wherein the heat spreading structure surrounds each of the LEDs.

8. The method of claim 7 in which assembling the heat spreading structure comprises:
applying a thermal conductive material to the thermal pad before placing the heat spreading structure in thermal communication with the thermal metal pad.

9. The method of claim 7 in which assembling the heat spreading structure comprises:
forming a solder pad in thermal communication with the thermal metal pad; and
attaching the heat spreading structure to the solder pad.

10. The method of claim 7 further comprising:
disposing a heat sink on a back side surface of the circuit board, the back side surface being opposite the front side surface.

11. The method of claim 7 in which the heat spreading structure covers substantially all of the front side surface of the circuit board.

12. The method of claim 7 further comprising:
disposing the LED module in an electronic application in which each of the plurality of LEDs is in electrical communication with circuitry that controls each of the plurality of LEDs to provide light.

13. A Light Emitting Diode (LED) assembly comprising:
a circuit substrate that has a front side and a back side;
a thermal pad formed of thermally conductive material on the front side of the circuit substrate;
an LED disposed on the front side of the circuit substrate and in direct contact with the thermal pad; and
means for spreading heat produced by the LED, the heat spreading means placed over the front side of the circuit substrate and having a hole to expose the LED, the heat spreading means being electrically isolated from electrical connections on the circuit substrate.

14. The LED assembly of claim 13 in which the heat spreading means covers substantially all of the front side.

15. The LED assembly of claim 13 further comprising a heat sink disposed upon the back side of the circuit substrate.

16. The LED assembly of claim 13 further comprising an interface between the thermal pad and the heat spreading means, the interface comprising at least one of a solder pad and thermally conductive grease.

17. The LED assembly of claim 13, wherein the thermally conductive material of the thermal pad includes a metal material.

18. The method of claim 7, wherein assembling the heat spreading structure over the front side surface of the circuit board so that the heat spreading structure is in thermal communication with the thermal pad includes mounting the heat spreading structure over the front side surface of the circuit board.

19. The LED assembly of claim 7, wherein the heat spreading structure includes at least one of aluminum, copper, iron, and silver.

20. The LED assembly of claim 13, wherein the heat spreading means is coupled to the thermal pad using a thermal interface material, wherein the thermal interface material includes at least one of a thermal conductive gel and a thermal conductive tape.

* * * * *